United States Patent
Masuda et al.

(10) Patent No.: US 10,113,247 B2
(45) Date of Patent: Oct. 30, 2018

(54) SEMICONDUCTOR SINGLE CRYSTAL PULLING APPARATUS AND METHOD FOR REMELTING SEMICONDUCTOR SINGLE CRYSTAL USING THIS

(71) Applicant: SHIN-ETSU HANDOTAI CO., LTD., Tokyo (JP)

(72) Inventors: Naoki Masuda, Echizen-cho (JP); Masahiko Urano, Nishigo-mura (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days.

(21) Appl. No.: 15/507,851

(22) PCT Filed: Sep. 9, 2015

(86) PCT No.: PCT/JP2015/004578
§ 371 (c)(1),
(2) Date: Mar. 1, 2017

(87) PCT Pub. No.: WO2016/051682
PCT Pub. Date: Apr. 7, 2016

(65) Prior Publication Data
US 2017/0292205 A1     Oct. 12, 2017

(30) Foreign Application Priority Data

Sep. 29, 2014   (JP) ................................ 2014-197843

(51) Int. Cl.
*C03B 15/14*     (2006.01)
*C30B 15/28*     (2006.01)
*C30B 15/14*     (2006.01)

(52) U.S. Cl.
CPC .............. *C30B 15/28* (2013.01); *C30B 15/14* (2013.01)

(58) Field of Classification Search
CPC ................................ C30B 15/20; C30B 15/28
See application file for complete search history.

(56) References Cited

U.S. PATENT DOCUMENTS

2010/0242836 A1* 9/2010 Korb ..................... C30B 15/28
  117/201
2010/0326349 A1* 12/2010 Fukui ..................... C30B 15/10
  117/15

FOREIGN PATENT DOCUMENTS

JP     H02-188487 A    7/1990
JP     H06-234592 A    8/1994
(Continued)

OTHER PUBLICATIONS

Dec. 19, 2017 Office Action issued in Japanese Patent Application No. 2016-551497.
(Continued)

*Primary Examiner* — Matthew J Song
(74) *Attorney, Agent, or Firm* — Oliff PLC

(57) ABSTRACT

A single crystal pulling apparatus including: a remelting detection apparatus which detects that remelting of a lower end portion of the semiconductor single crystal is completed from a change in weight of the semiconductor single crystal when the lower end portion of the semiconductor single crystal is immersed in the melt to be remolten by using the wire; and a lowermost end detection apparatus which detects a lowermost end of the semiconductor single crystal from a position where no current flows between the semiconductor single crystal and the melt when the semiconductor single crystal is taken up with the use of the wire while applying a voltage between the semiconductor single crystal and the melt by applying a voltage between the crucible and the wire.

12 Claims, 4 Drawing Sheets

(56) References Cited

FOREIGN PATENT DOCUMENTS

| JP | H08-301687 A | 11/1996 | |
|---|---|---|---|
| JP | 2000-264780 A | 9/2000 | |
| JP | 2000264780 A * | 9/2000 | ............. C30B 15/26 |
| JP | 2009-132552 A | 6/2009 | |

OTHER PUBLICATIONS

Nov. 24, 2015 International Search Report issued in International Patent Application No. PCT/JP2015/004578.

* cited by examiner

SEMICONDUCTOR SINGLE CRYSTAL PULLING APPARATUS AND METHOD FOR REMELTING SEMICONDUCTOR SINGLE CRYSTAL USING THIS

TECHNICAL FIELD

The present invention relates to a method for manufacturing a single crystal based on a Czochralski method (which also will be referred to as a CZ method hereinafter), and to a method for remelting when a dislocation has occurred during growth of a single crystal.

BACKGROUND ART

As a method for manufacturing a silicon single crystal, the Czochralski method is known. According to this method, a raw material lump is contained in a quartz crucible installed in a chamber and heated by a heater, and the raw material in the crucible is turned to a melt. Further, a seed crystal is contacted with a raw material melt surface and pulled while being rotated, and a silicon single crystal having a desired diameter and quality is grown.

In a process of manufacturing a silicon single crystal, in order to eliminate a dislocation contained in the seed crystal or a dislocation generated by heat shock at the time of liquid contacting or the like, the diameter is once narrowed to approximately 3 to 4 mm in a Dash-necking process to form a neck portion.

Then, a straight body portion which turns to a product is formed through a corn process of gradually increasing the diameter to a desired diameter. At last, in order to reduce an influence of a dislocation due to the heat shock caused at the time of separating from the silicon melt, a tail portion having a reduced diameter is formed and separated from the silicon melt.

However, in the process of manufacturing a silicon single crystal, a dislocation is generated in the corn process or the straight body process due to various disturbances in some situations. In this case, since single-crystallization of a crystal formed in a subsequent process is impaired, a value as a product is lost. Thus, if a dislocation is generated in an early stage in the silicon single crystal manufacturing process, a single crystal manufactured thus far is again molten (which will be referred to as remelting hereinafter), and then manufacture of the single crystal is again performed.

In a process of remelting, a temperature of the melt is increased to a temperature at which the crystal is molten. Then, the crystal is immersed in the melt and molten. At this time, since attention must be given such that the crystal does not come into contact with a crucible bottom portion, it is preferable to immerse the crystal in the range of approximately 20 to 50 mm. After confirming that the immersed crystal is molten, an operation of likewise immersing the crystal in the melt is repeated, and all manufactured crystals are molten.

In a method for manufacturing a silicon single crystal disclosed in Patent Document 1, as means for efficiently remelting a crystal in which a dislocation has occurred, a method for immersing the crystal at a fixed average velocity while applying vibration of vertical movement thereto is described.

CITATION LIST

Patent Literature

Patent Document 1: Japanese Unexamined Patent Application Publication (Kokai) No. 2009-132552

DISCLOSURE OF INVENTION

Problem to be Solved by the Invention

However, there is a situation where a conical unmolten residue is produced at a central portion of a crystal depending a temperature of the melt. In such a case, according to the method described in Patent Document 1, when falling is continued while melting of the crystal immersed in the melt is not completed, the crystal comes into contact with the crucible bottom surface, and there is a danger that the crucible is damaged.

Thus, in order to determine whether melting of the immersed crystal is completed, visual confirmation by an operator is required. In this case, the operator must perform an operation of separating the crystal from the melt and pulling it up at regular time intervals, and confirming a molten state of the crystal from an observation window.

Furthermore, if a crystal to be molten is long, a considerable time is required until the crystal is completely molten, monitoring must be repeated during this period, and hence a major burden is imposed on the operator.

Moreover, when monitoring timing cannot be made to match and the crystal is left even though melting is completed, electric power is wastefully consumed during this period, and a melt temperature increases, which results in a problem of degradation of the quartz crucible. Additionally, remelting is a process which does not contribute to production, and the electric power and a labor cost all go to waste during this period, and hence efficient remelting has been desired.

To solve the problem, it is an object of the present invention to provide a semiconductor single crystal pulling apparatus and a remelting method which enable effective remelting without requiring visual confirmation to determine whether melting of an immersed crystal is completed in remelting of the semiconductor single crystal.

Means for Solving Problem

To achieve the object, according to the present invention, there is provided a semiconductor single crystal pulling apparatus which is a single crystal pulling apparatus including a heater for performing heating and thermal insulation to a crucible containing a melt and a wire for growing a semiconductor single crystal while pulling the same from the melt, wherein the single crystal pulling apparatus comprises:

a remelting detection apparatus which detects that remelting of a lower end portion of the semiconductor single crystal is completed from a change in weight of the semiconductor single crystal when the lower end portion of the semiconductor single crystal is immersed in the melt so as to be remolten by using the wire; and a lowermost end detection apparatus which detects a lowermost end of the semiconductor single crystal from a position where no current flows between the semiconductor single crystal and the melt when the semiconductor single crystal is taken up with the use of the wire while applying a voltage between the semiconductor single crystal and the melt by applying a voltage between the crucible and the wire.

According to such a semiconductor single crystal pulling apparatus, since whether remelting of the lower end portion of the semiconductor single crystal is completed can be detected based on a change in weight of the semiconductor single crystal, it is not necessary to confirm whether the remelting of the lower end portion of the semiconductor single crystal is completed by visual confirmation. Further, the lowermost end of the semiconductor single crystal can be electrically detected. Thus, an apparatus which can automate the remelting can be provided.

Furthermore, according to the present invention, there is provided a method for remelting a semiconductor single crystal which is a method for immersing a lower end portion of the semiconductor single crystal in a melt and remelting the same by using the above-mentioned single crystal pulling apparatus, the method comprising:

a crystal immersion step of immersing the lower end portion of the semiconductor single crystal in the melt and remelting the lower end portion by lowering the wire of the single crystal pulling apparatus;

a remelting detection step of detecting that melting of the lower end portion of the semiconductor single crystal immersed in the melt is completed from a change in weight of the semiconductor single crystal by using the remelting detection apparatus;

a lowermost end detection step of taking up the semiconductor single crystal with the use of the wire while applying a voltage between the semiconductor single crystal and the melt, and detecting a lowermost end of the semiconductor single crystal from a position where no current flows between the semiconductor single crystal and the melt by using the lowermost end detection apparatus; and a determination step of determining whether the crystal immersion step is to be restarted or whether the remelting is to be terminated after end of the lowermost end detection step.

As described above, since the semiconductor single crystal pulling apparatus of the present invention is used, completion of the remelting of the lower end portion of the immersed semiconductor single crystal does not have to be visually confirmed, and hence the remelting can be efficiently performed.

At this time, in the remelting detection step, when the change in weight of the semiconductor single crystal reaches a predetermined value or less, it is possible to detect that the remelting of the immersed lower end portion of the semiconductor single crystal is completed.

As described above, if completion of the remelting of the lower end portion of the immersed semiconductor single crystal is detected when a change in weight of the semiconductor single crystal reaches a predetermined value or less, completion of remelting of the lower end portion of the semiconductor single crystal can be more accurately detected.

At this time, in the determination step, when the weight of the semiconductor single crystal reaches a predetermined weight or less, the remelting can be determined to be terminated.

As described above, when the weight of the semiconductor single crystal becomes the predetermined weight or less, termination of remelting can be determined.

At this time, in the determination step, when the crystal immersion step is determined to be restarted, a length of the lower end portion of the semiconductor single crystal to be immersed in the melt is preferably set to be less than a depth of the melt in the crucible from the detected lowermost end of the semiconductor single crystal at the subsequent crystal immersion step.

As a result, even if an unmolten residue is present in the lower end portion of the semiconductor single crystal, the length of the lower end portion of the semiconductor single crystal which is immersed into the melt is set to be less than the depth of the melt in the crucible, and hence the semiconductor single crystal can be prevented from coming into contact with the crucible bottom portion.

Further, at this time, the semiconductor single crystal can be automatically remolten by automatically performing the crystal immersion step, the remelting detection step, the lowermost end detection step, and the determination step.

As described above, in the present invention, since the remelting of the semiconductor single crystal can be automatically performed, the remelting can be efficiently carried out.

Effect of the Invention

According to the semiconductor single crystal pulling apparatus and the method for remelting a semiconductor single crystal of the present invention, since whether the remelting of the lower end portion of the semiconductor single crystal is completed can be detected from a change in weight of the semiconductor single crystal, it is not necessary to visually confirm that the remelting of the lower end portion of the semiconductor single crystal is completed. Furthermore, since the lowermost end of the semiconductor single crystal can be electrically detected, accurate detection can be carried out.

Moreover, according to the method for remelting a semiconductor single crystal using the semiconductor single crystal pulling apparatus of the present invention described above, since completion of the remelting of the immersed lower end portion of the semiconductor single crystal does not have to be visually confirmed, the remelting can be efficiently carried out.

BEST MODE(S) FOR CARRYING OUT THE INVENTION

An embodiment of the present invention will now be described hereinafter, but the present invention is not restricted thereto.

A semiconductor single crystal pulling apparatus of the present invention will now be described.

Figure 1:
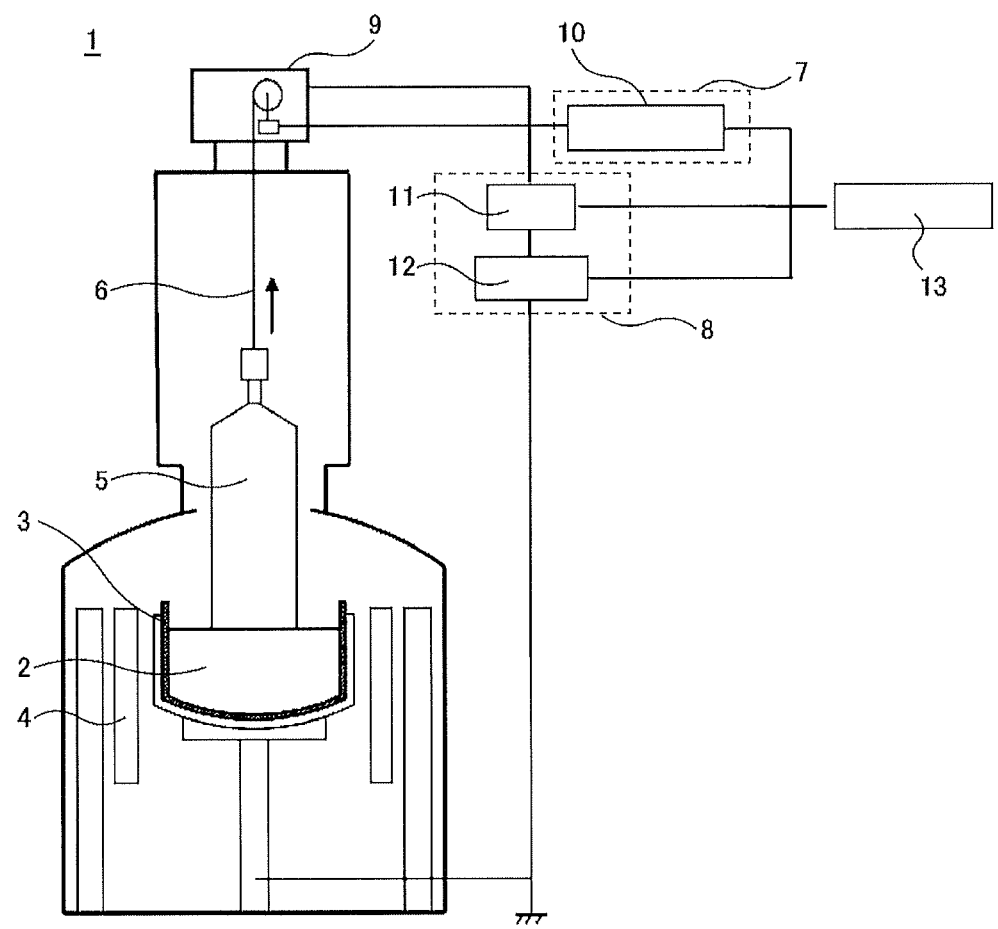
FIG. 1 is a schematic view showing an example of a semiconductor single crystal pulling apparatus according to the present invention.

As shown in FIG. 1, a semiconductor single crystal pulling apparatus 1 includes a heater 4 which performs heating and thermal insulation to a crucible 3 containing a melt 2, a wire 6 which grows a semiconductor single crystal 5 from the melt 2 while pulling the same, a remelting detection apparatus 7, and a lowermost end detection apparatus 8.

The remelting detection apparatus 7 can measure a weight of the semiconductor single crystal 5 by using a weight measuring instrument 10 connected to a wire take-up section 9. Additionally, the remelting detection apparatus 7 can detect that remelting of a lower end portion of the semiconductor single crystal 5 is completed from a change in weight of the semiconductor single crystal 5 when the wire 6 is lowered to immerse the lower end portion of the semiconductor single crystal 5 in the melt 2 and remelt the same. The weight measuring instrument 10 can be, e.g., a load cell.

Further, a power supply 11 and an ammeter 12 of the lowermost end detection apparatus 8 are electrically connected to the crucible 3 and the wire 6. Furthermore, the wire take-up section 9 and the wire 6 are insulated from the earth (ground). Thus, when the power supply 11 is connected between the crucible 3 and the wire 6 and a voltage is applied, since a closed circuit is formed in a case where the semiconductor single crystal 5 is in contact with the melt 2, a fine current flows. On the other hand, when the semiconductor single crystal 5 is separated from the melt 2, since no closed circuit is formed, no current flows.

By utilizing such properties, the lowermost end of the semiconductor single crystal 5 is detected from a position where no current flows between the semiconductor single crystal 5 and the melt 2 at the time of taking up the semiconductor single crystal 5 with the use of the wire 6 while applying the voltage between the semiconductor single crystal 5 and the melt 2 by applying the voltage between the crucible 3 and the wire 6 by using the lowermost end detection apparatus 8.

Furthermore, the wire take-up section 9 can be controlled by a control apparatus 13 connected to the remelting detection apparatus 7 and the lowermost end detection apparatus 8.

According to such a semiconductor single crystal pulling apparatus 1, since whether the remelting of the lower end portion of the semiconductor single crystal is completed can be detected from a change in weight of the semiconductor single crystal, it is not necessary to visually confirm that the remelting of the lower end portion of the semiconductor single crystal is completed. Moreover, the lowermost end of the semiconductor single crystal can be electrically and accurately detected.

Next, a method for remelting a semiconductor single crystal of the present invention using the single crystal pulling apparatus of the present invention will now be described.

(Crystal Immersion Step)

First, the wire 6 of the semiconductor single crystal pulling apparatus 1 of the present invention described above is lowered to immerse the lower end portion of the semiconductor single crystal 5 in the melt 2 and remelt the same.

(Remelting Detection Step)

Additionally, the remelting detection apparatus 7 is used to detect that melting of the lower end portion of the semiconductor single crystal 5 immersed in the melt 2 is completed from a change in weight of the semiconductor single crystal 5.

At this time, it is preferable to detect that the remelting of the immersed lower end portion of the semiconductor single crystal 5 is completed when a change in weight of the semiconductor single crystal 5 reaches a predetermined value or less.

As described above, when a change in weight of the semiconductor single crystal 5 reaches a predetermined weight or less, termination of the remelting can be determined. That is, the weight of the single crystal gradually decreases when the melting of the single crystal advances, and the remelting can be determined to be completed when this change is hardly seen.

(Lowermost End Detection Step)

The semiconductor single crystal 5 is taken up by using the wire 6 while applying a voltage between the semiconductor single crystal 5 and the melt 2. Further, the lowermost end detection apparatus 8 is used to detect a position where no current flows between the semiconductor single crystal 5 and the melt 2, i.e., a position where the lowermost end of the semiconductor single crystal 5 is apart from the melt, thereby detecting the lowermost end of the semiconductor single crystal 5.

Since the lowermost end of the semiconductor single crystal 5 can be accurately detected in this manner, the crystal can be again immersed from the detected lowermost end of the semiconductor single crystal 5 at the time of performing remelting again. Consequently, for example, when an unmolten residue is present in the lower end portion of the semiconductor single crystal 5, the crystal can be constantly immersed in the melt by the same length without allowing the single crystal to hit on a crucible bottom portion.

(Determination Step)

After end of the lowermost end detection step, whether the crystal immersion step is again started or whether the remelting is terminated is determined.

At this time, for example, when the weight of the semiconductor single crystal 5 reaches a predetermined weight or less, almost all single crystals are considered to have been molten, and termination of the remelting can be determined.

Further, at this time, when the crystal immersion step is determined to restart, it is preferable, at the subsequent crystal immersion step, to set a length of the lower end portion of the semiconductor single crystal 5 which is to be immersed in the melt 2 to be less than a depth of the melt 2 in the crucible 3 from the lowermost end of the semiconductor single crystal 5 detected at the lowermost end detection step.

When the length of the lower end portion of the semiconductor single crystal 5 which is to be immersed in the melt 2 is set to be less than the depth of the melt 2 in the crucible 3 from the detected lowermost end of the semiconductor single crystal 5 in this manner, it is possible to surely prevent the lower end portion of the semiconductor single crystal 5 from coming into contact with the bottom of the crucible 3 and the crucible 3 from being damaged.

According to such a method for remelting a semiconductor single crystal of the present invention, at the time of the remelting, completion of the remelting of the lower end portion of the semiconductor single crystal can be detected from a change in weight of the semiconductor single crystal, it is not necessary to visually confirm that the remelting is completed. Furthermore, since the lowermost end of the semiconductor single crystal can be detected, the semiconductor single crystal can be remolten without damaging the crucible due to an unmolten residue.

Moreover, automatically performing the crystal immersion step, the remelting detection step, the lowermost end detection step, and the determination step enables automatically remelting the semiconductor single crystal.

As described above, since completion of the remelting of the semiconductor single crystal is detected from a change in weight of the crystal, the remelting of the semiconductor single crystal including immersion of the crystal can be automatically carried out. Thus, the remelting of the semiconductor single crystal can be efficiently performed.

Thus, the crystal remelting step in the semiconductor single crystal manufacture can be automated, and a burden imposed on an operator can be alleviated. Additionally, the remelting can be carried out without a wasteful time, and electric power loss and degradation in the quartz crucible can be suppressed to the minimum level. Further, the automation can prevent accidents caused due to labor saving, an operation mistake, and the like and a reduction in productivity.

EXAMPLES

Although the present invention will now be more specifically described hereinafter with reference to examples and a comparative example of the present invention, the present invention is not restricted thereto.

Example 1

Figure 2:
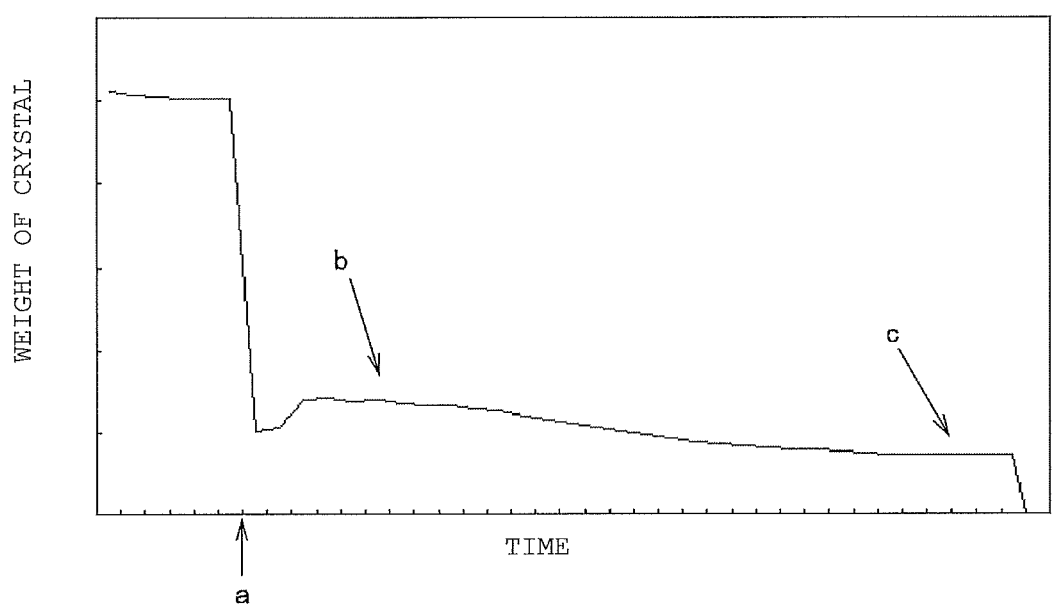
FIG. 2 is a view showing a relationship between a weight of a crystal and a time when the crystal is remolten by using the semiconductor single crystal pulling apparatus according to the present invention in Example 1.

Remelting of a semiconductor single crystal 5 was performed by using such a semiconductor single crystal pulling apparatus 1 of the present invention as shown in FIG. 1. At this time, a change in weight of the semiconductor single crystal 5 was measured by a weight measuring instrument 10 (a load cell), and the weight of the semiconductor single crystal 5 during a remelting process was observed. FIG. 2 shows a measurement result obtained here.

As shown in FIG. 2, when the semiconductor single crystal 5 was immersed in a melt 2, a precipitous change in weight occurs due to an influence of buoyancy force (a). It was found out that, when this state is left untreated, a gradual change in weight continues due to melting of the semiconductor single crystal 5 (b), and the weight eventually becomes substantially fixed (c).

At this time, when the weight became substantially fixed and its change became 200 g or less per minute, the crystal was taken up by the wire 6, and a molten state of the semiconductor single crystal 5 was confirmed. As a result, it was possible to determine that remelting of a lower end portion of the semiconductor single crystal 5 immersed in the melt 2 was substantially completed.

Based on this result, it was found out that inputting a crystal weight after immersing the crystal in the silicon melt to the control apparatus and monitoring a change in weight enables automating a determination on completion of the melting.

Example 2

Figure 3:
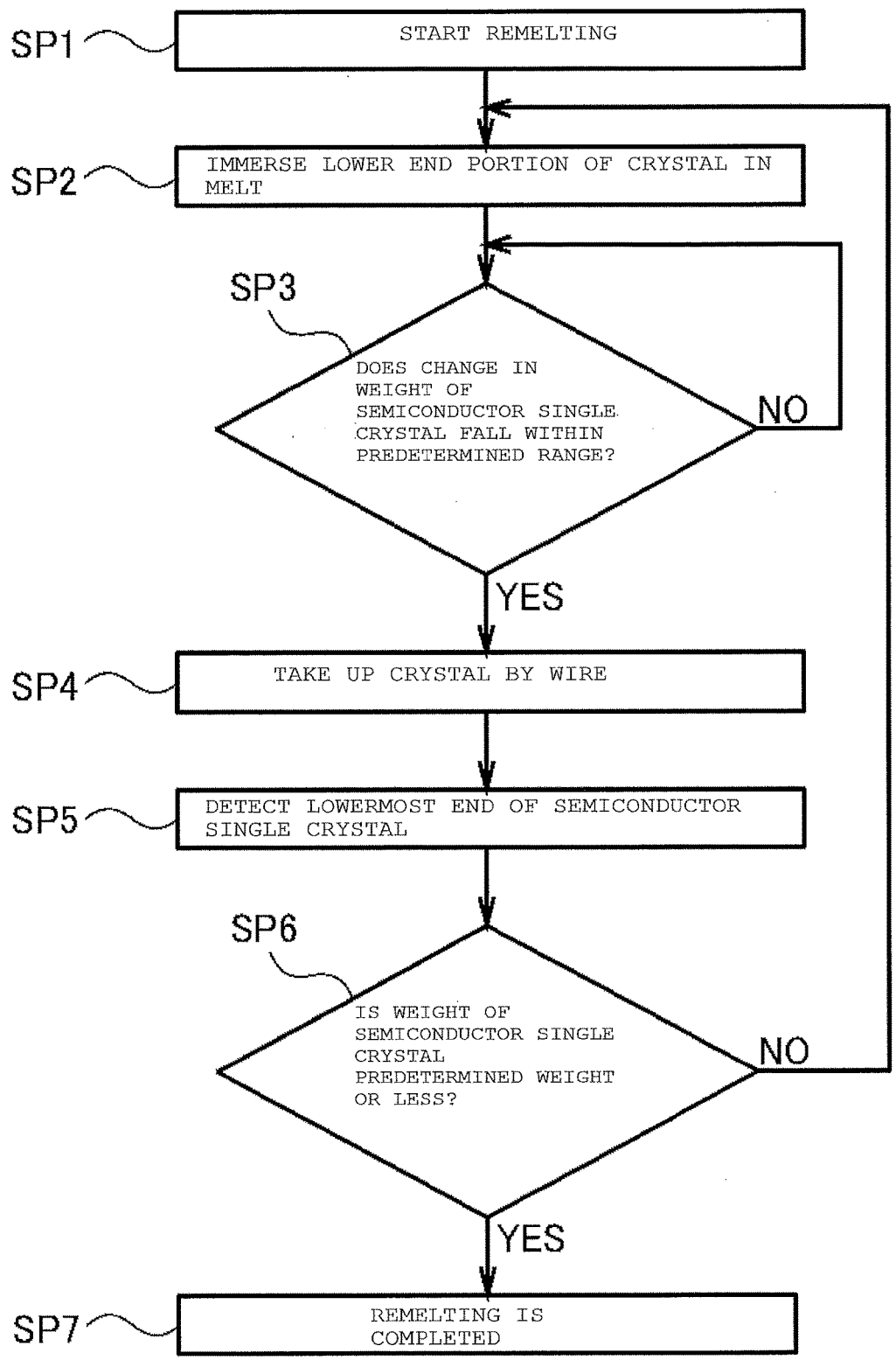
FIG. 3 is a process chart of a method for remelting a semiconductor single crystal in Example 2.

Remelting of a semiconductor single crystal 5 was started by using such a semiconductor single crystal pulling apparatus 1 of the present invention as shown in FIG. 1 based on such steps as shown in FIG. 3 (SP1). It is to be noted that a control apparatus 13 was programmed to automate the following steps, and the remelting was automatically carried out. It is to be noted that, as the semiconductor single crystal 5 to be remolten, one having a straight body portion of approximately 20 cm was used.

(Crystal Immersion Step)

First, a wire 6 was lowered, and a lower end portion of the semiconductor single crystal 5 was immersed in a melt 2 by 40 mm (SP2).

(Remelting Detection Step)

A weight of the semiconductor single crystal 5 at this moment is measured by a weight measuring instrument 10 (a load cell) as required, and a result thereof is transferred to the control apparatus 13. At this time, a setting was configured in advance such that, if a change in weight of the semiconductor single crystal 5 falls within a predetermined range (e.g., 200 g or less per minute), a remelting detection apparatus 7 detects that the melting of the lower end portion of the semiconductor single crystal 5 is completed (SP3).

(Lowermost End Detection Step)

Upon detecting completion of the melting of the lower end portion of the semiconductor single crystal 5, the semiconductor single crystal 5 was taken up by a wire 6 while applying a voltage between the semiconductor single crystal 5 and the melt 2 (SP4). Further, a lowermost end of the semiconductor single crystal 5 was detected by a lowermost end detection apparatus 8 from a position where no current flows between the semiconductor single crystal 5 and the melt 2 (SP5).

(Determination Step)

Furthermore, when a weight of the semiconductor single crystal 5 at this moment was heavier than a predetermined weight (e.g., 1 kg), the processing returned to SP2, and the crystal immersion step was performed again. On the other hand, when the weight of the semiconductor single crystal 5 was the predetermined weight (e.g., 1 kg) or less, a determination was made so as to terminate the remelting (SP6).

Moreover, when the processing returned to SP2 and the crystal immersion step was restarted, a length of the lower end portion of the semiconductor single crystal 5 to be immersed in the melt was set to 40 mm which is less than a depth of the melt 2 in the crucible 3.

As described above, the semiconductor single crystal 5 was automatically remolten, and the remelting was terminated when the weight of the semiconductor single crystal 5 became the predetermined weight (e.g., 1 kg) or less (SP7).

Figure 4:
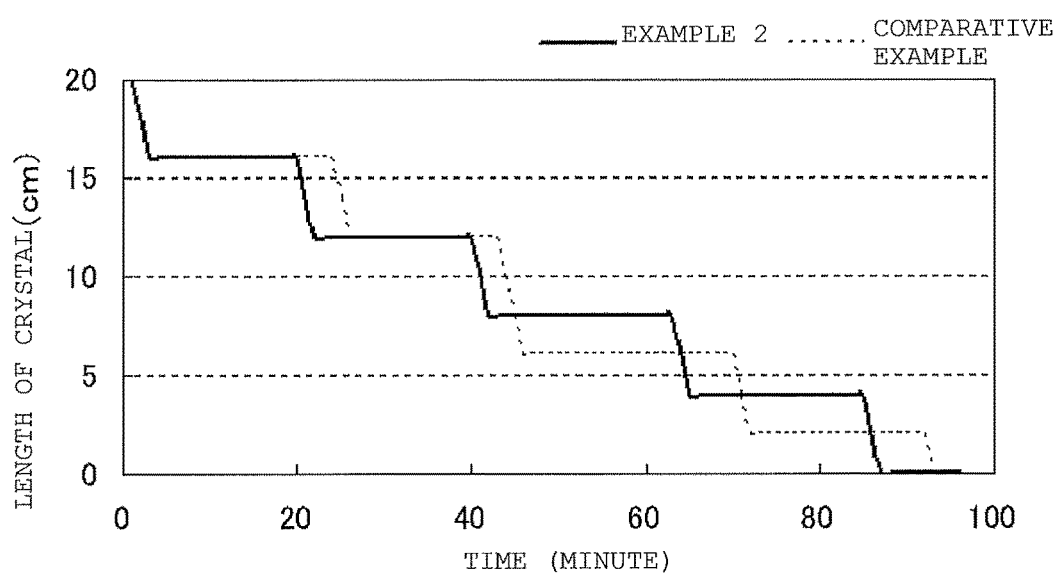
FIG. 4 is a view showing a relationship between a length of a crystal and a time in each of Example 2 and a Comparative Example.

A relationship between the length of the semiconductor single crystal and a time was indicated by a solid line in FIG. 4. Additionally, FIG. 4 shows a result of a later-described Comparative Example by a broken line.

Comparative Example

A semiconductor single crystal was remolten by using a single crystal pulling apparatus which does not include a remelting detection apparatus and a lowermost end detection apparatus which are those adopted in the semiconductor single crystal pulling apparatus of the present invention. Further, whether a lower end portion of the semiconductor single crystal had been completed was visually confirmed by an operator. Furthermore, as the semiconductor single crystal to be remolten, one having a straight body portion of 20 cm like Example 2 was used. A relationship between a length of the semiconductor single crystal and a time was indicated by a broken line in FIG. 4.

As shown in FIG. 4, in Comparative Example, since whether remelting of the semiconductor single crystal had been completed was visually confirmed, there was a variation in immersion time depending on monitoring timing of the operator.

On the other hand, in the result of Example 2, since the remelting was automatically performed, this variation was small, the immersion was repeated at substantially the same time intervals, and the remelting was accurately carried out without wastefully leaving the situation.

It is to be noted that the present invention is not restricted to the foregoing embodiment. The foregoing embodiment is an illustrative example, and any example which has substantially the same configuration and exerts the same functions and effects as the technical concept described in claims of the present invention is included in the technical scope of the present invention.

The invention claimed is:

1. A method for remelting a semiconductor single crystal which is a method for immersing a lower end portion of the semiconductor single crystal in a melt and remelting the same by using a single crystal pulling apparatus, the single crystal pulling apparatus comprising a heater for performing heating and thermal insulation to a crucible containing a melt and a wire for growing a semiconductor single crystal while pulling the same from the melt,
wherein the semiconductor single crystal pulling apparatus comprises:
a remelting detection apparatus which detects that remelting of a lower end portion of the semiconductor single crystal is completed from a change in weight of the semiconductor single crystal when the lower end portion of the semiconductor single crystal is immersed in the melt so as to be remolten by using the wire; and
a lowermost end detection apparatus which detects a lowermost end of the semiconductor single crystal from a position where no current flows between the semiconductor single crystal and the melt when the semiconductor single crystal is taken up with the use of the wire while applying a voltage between the semiconductor single crystal and the melt by applying a voltage between the crucible and the wire,
the method comprising:
a crystal immersion step of immersing the lower end portion of the semiconductor single crystal in the melt and remelting the lower end portion by lowering the wire of the single crystal pulling apparatus;
a remelting detection step of detecting that melting of the lower end portion of the semiconductor single crystal immersed in the melt is completed from a change in weight of the semiconductor single crystal by using the remelting detection apparatus;
a lowermost end detection step of taking up the semiconductor single crystal with the use of the wire while applying a voltage between the semiconductor single crystal and the melt, and detecting a lowermost end of the semiconductor single crystal from a position where no current flows between the semiconductor single crystal and the melt by using the lowermost end detection apparatus; and
a determination step of determining whether the crystal immersion step is to be restarted or whether the remelting is to be terminated after end of the lowermost end detection step.

2. The method for remelting a semiconductor single crystal according to claim 1,
wherein, in the remelting detection step,
when the change in weight of the semiconductor single crystal reaches a predetermined value or less, it is detected that the remelting of the immersed lower end portion of the semiconductor single crystal is completed.

3. The method for remelting a semiconductor single crystal according to claim 2,
wherein, in the determination step,
when the weight of the semiconductor single crystal reaches a predetermined weight or less, the remelting is determined to be terminated.

4. The method for remelting a semiconductor single crystal according to claim 3,
wherein the semiconductor single crystal is automatically remolten by automatically performing the crystal immersion step, the remelting detection step, the lowermost end detection step, and the determination step.

5. The method for remelting a semiconductor single crystal according to claim 2,
wherein, in the determination step, when the crystal immersion step is determined to be restarted,
a length of the lower end portion of the semiconductor single crystal to be immersed in the melt is set to be less than a depth of the melt in the crucible from the detected lowermost end of the semiconductor single crystal at the subsequent crystal immersion step.

6. The method for remelting a semiconductor single crystal according to claim 5,
wherein the semiconductor single crystal is automatically remolten by automatically performing the crystal immersion step, the remelting detection step, the lowermost end detection step, and the determination step.

7. The method for remelting a semiconductor single crystal according to claim 2,
wherein the semiconductor single crystal is automatically remolten by automatically performing the crystal immersion step, the remelting detection step, the lowermost end detection step, and the determination step.

8. The method for remelting a semiconductor single crystal according to claim 1,
wherein, in the determination step,
when the weight of the semiconductor single crystal reaches a predetermined weight or less, the remelting is determined to be terminated.

9. The method for remelting a semiconductor single crystal according to claim 8,
wherein the semiconductor single crystal is automatically remolten by automatically performing the crystal immersion step, the remelting detection step, the lowermost end detection step, and the determination step.

10. The method for remelting a semiconductor single crystal according to claim 1,
wherein, in the determination step, when the crystal immersion step is determined to be restarted,
a length of the lower end portion of the semiconductor single crystal to be immersed in the melt is set to be less than a depth of the melt in the crucible from the detected lowermost end of the semiconductor single crystal at the subsequent crystal immersion step.

11. The method for remelting a semiconductor single crystal according to claim 10,
wherein the semiconductor single crystal is automatically remolten by automatically performing the crystal immersion step, the remelting detection step, the lowermost end detection step, and the determination step.

12. The method for remelting a semiconductor single crystal according to claim 1,
wherein the semiconductor single crystal is automatically remolten by automatically performing the crystal immersion step, the remelting detection step, the lowermost end detection step, and the determination step.

* * * * *